US006887514B2

(12) United States Patent
Ouellet et al.

(10) Patent No.: US 6,887,514 B2
(45) Date of Patent: May 3, 2005

(54) METHOD OF DEPOSITING OPTICAL FILMS

(75) Inventors: Luc Ouellet, Granby (CA); Jonathan Lachance, Granby (CA); Manuel Grondin, Granby (CA); Stephane Blain, Sherbrooke (CA)

(73) Assignee: Dalsa Semiconductor Inc., Waterloo (CA)

( * ) Notice: Subject to any disclaimer, the term of this patent is extended or adjusted under 35 U.S.C. 154(b) by 485 days.

(21) Appl. No.: 09/867,662

(22) Filed: May 31, 2001

(65) Prior Publication Data

US 2002/0192393 A1 Dec. 19, 2002

(51) Int. Cl.$^7$ .............................. B05D 5/04; H05H 1/24
(52) U.S. Cl. .................... 427/163.2; 427/574; 427/578; 427/579; 427/167
(58) Field of Search ................................ 427/574, 578, 427/8, 163.2, 167, 255.28, 376.2, 579

(56) References Cited

U.S. PATENT DOCUMENTS

| | | | |
|---|---|---|---|
| 4,236,905 A | | 12/1980 | Dabby et al. |
| 4,394,401 A | * | 7/1983 | Shioya et al. ................ 427/574 |
| 5,409,743 A | * | 4/1995 | Bouffard et al. ............. 427/579 |
| 5,660,895 A | | 8/1997 | Lee et al. |
| 5,834,796 A | * | 11/1998 | Matsuda et al. ............... 257/57 |
| 5,861,197 A | * | 1/1999 | Law et al. .................... 427/579 |
| 5,885,881 A | * | 3/1999 | Ojha ........................... 438/381 |
| 6,130,172 A | | 10/2000 | Fuller et al. |
| 6,537,623 B2 | * | 3/2003 | Ouellet et al. ............... 427/579 |
| 6,670,695 B1 | * | 12/2003 | Gau et al. .................... 257/649 |

FOREIGN PATENT DOCUMENTS

| | | |
|---|---|---|
| EP | 0 788 148 A1 | 8/1997 |
| EP | 1 134 073 A1 | 9/2001 |
| JP | 279303 | * 12/1987 |
| JP | 03274272 A | 12/1991 |
| JP | 10319263 A2 | 12/1998 |
| WO | WO 97/25636 | 7/1997 |

OTHER PUBLICATIONS

Hsieh et al., "Characteristics of low–temperature and low–enenergy plasma–enhanced chemical vapor deposited SiO2", Journal Applied Physics 74 (4), Aug. 15, 1993, pp. 2638–2648.*

Kim, Kihong, et al., "Properties of low dielectric constant fluorinated silicon oxide films prepared by plasma enhanced chemical vapor deposition", Thin Solid Films, 1998, vol. 332, No. 1/2, pp. 369–374.

Takamatsu, Akira et al., "Plasma–activated deposition and properties of phosphosilicate glass film", Journal of Electrochemical Society, 1984, vol. 131, No. 8, pp. 1865–1870.

D.K.W. Lam, "Low temperature plasma chemical vapor deposition of silicon oxynitride thin–film waveguides", Applied Optics, vol. 23, No. 16, Aug. 15, 1984, pp, 27442746.

Franco Bruno et al., "Plasma–enhanced chemical vapor deposition of low–loss SiON optical waveguides at 1.5–$\mu$m wavelength", Applied Optics, vol. 30, No. 31, Nov. 1, 1991, pp. 4560–4564.

K. Imoto, et al., "High refractive index difference and low loss optical waveguide fabricated by low temperature processes", Electronics Letters, vol. 29, No. 12, Jun. 10, 1993, pp. 1123–1124.

Q. Lai et al., "Simple technologies for fabrication of low–loss silica waveguides", Electronics Letter, Mar. 31, 1992.

Yuan–Kuang Tu, et al., "Single–mode SiON/SiON$_2$/Si Optical Waveguides Prepared by Plasma–Enhanced Chemical Vapor Deposition", Fiber and Integrated Optics, vol. 14, pp. 133–139.

S. Yokoyama et al., "Optical waveguides on silicon chips", J.Vac. Sci. Technol. A13(3), May/Jun. 1995, pp. 629–635.

O.P. Agnihotri et al., "Silicon Oxynitirde Waveguides for Optoelectronic Integrated Circuits", Jpn. Appl., vol. 36, Part 1, No. 11, Nov. 1997, pp. 6711–6713.

Daniel P. Poenar et al., "Optical properties of thin–film silicon–compatible materials", Applied Optics, vol. 36, No. 21, Jul. 20, 1997, pp. 5122–5128.

I. Pereyra et al., "High quality low temperature DPECVD silicon dioxide", Journal of Non–Crystalline Solids, 212, 1997, pp. 225–231.

M.I. Alayo, et al., "Thick SiO$_x$N$_y$ and SiO$_2$ films obtained by PECVD techniques at low temprature", Thin Film Solids, 332, 1998, pp. 40–45.

R. German et al., "Silicon–Oxynitride Layer for Optical Waveguide Applications", The Electronic Society Inc., vol. 99–1, May 199, Abstract No. 137.

K. Worhoff et al., "Plasma enhanced chemical vapor deposition silicon oxynitride optimized for application in integrated optics", Sensor and Actuators, 74, 1999, pp. 9–12.

A.J. Kenyon et al., "A luminescence study of silicon–rich silica and rare–earth doped silicon–rich silica", Electrochemical Society Proceedings vol. 91–11, pp. 304–318.

(Continued)

Primary Examiner—Brian K. Talbot
(74) Attorney, Agent, or Firm—Marks & Clerk; Richard J. Mitchell

(57) ABSTRACT

To deposit optical quality films by PECVD (Plasma Enhanced Chemical Vapor Deposition), a six-dimensional space wherein five dimensions thereof correspond to five respective independent variables of which a set of four independent variables relate to the flow-rate of respective gases, a fifth independent variable relates to total pressure, and a six dimension relates to observed FTIR characteristics is first created. Then an optical film is deposited while maintaining three of the set of four independent variables substantially constant as well as the fifth independent variable, and varying a fourth of the set of four independent variables to obtain desired characteristics in the sixth dimension.

19 Claims, 10 Drawing Sheets

OTHER PUBLICATIONS

M. Hoffmann et al., "Low temprature, nitrogen doped waveguides on silicon with small core dimensions fabricated by PECVD/RIE", Waveguide Technology, WeC2, pp. 299–301.

M. Hoffmann et al., Low–Loss Fiber–Matched Low–Temperature PECVD Waveguides with Small–Core Dimensions for Optical Communications Systems, IEEE Photonics Technology Letters, vol. 9, No. 9, Sep. 1997, pp. 1238–1240.

K. Kapser et al., Rapid Deposition of High–Quality Silicon–Oxynitride Waveguides, IEEE Transactions Photonics Technology Letters, vol. 3, No. 12, Dec. 1991, pp. 1096–1098.

D.A.P. Bulla et al., "Deposition of thick TEOS PECVD silicon oxide layers for integrated optical waveguide applications", Thin Solid Films, 334, 1998, pp. 60–64.

E.S. Bulat et al., "Fabrication of waveguides using low–temperature plasma processing techniques", J. Vac. Sci. Techol. A 11(4) Jul./Aug. 1993, pp. 1268–1274.

M.V> Bazylenko et al. Fabrication of Low–Temperature PECVD Channel Waveguides with Significantly Improved Loss in the 1.50–1.55–$\mu$m Wavelength Range, IEE Photonics Technology Letters, vol. 7, No. 7, Jul. 1995, pp. 774–776.

M.V. Bazylenko et al., "Pure and fluorine–doped silica films deposited in a hollow cathode reactor for integrated optic applications", J. Vac. Sci. Technol. A 14(2), Mar./Apr. 1996, pp. 336–345.

A. Durandet et al., "Silica buried channel waveguides fabricated at low temperature using PECVD", Electronics Letters, vol. 32, No. 4, Feb. 15, 1996, pp. 326–327.

R.W. Boswell et al., "Deposition of silicon dioxide films using the helicon diffusion reactor for integrated optics applications", Plasma Processing of Semiconductors, 1997, pp. 433–475.

S. Valette et al., New Integrated Optical Multiplexer–Demultiplexer Realized on Silicon Substrate, ECIO87, May 1987, pp. 145–147.

S. Valette, "State of the art of integrated optics technology at LETI for achieving passive optical components", Journal of Modern Optics, vol. 35, No. 6, 1998, pp. 993–1005.

G. Grand et al., "Low–Loss PECVD Silica Channel Waveguides for Optical Communications", Electronic Letters, vol. 26, No. 25, Dec. 6, 1990, pp. 2135–21–37.

S.M. Ojha et al., "Simple method of fabricating polarisation–insensitive and very low crosstalk AWG grating devices", Electronic Letters, vol. 34, No. 1, Jan. 8, 1998, pp. 78–79.

C.M. Johnson et al., "Thermal annealing of waveguides formed by ion implantation of silica–on–Si", Nuclear Instruments and Methods in Physics Research B 141, 1998, pp. 670–674.

Karen Liu et al., "Hybrid optoelectronic digitally tunable receiver", SPIE, vol. 2402, pp. 104–114.

Rene M. de Ridder et al., "Silicon Oxynitride Planar Waveguiding Structure for Application in Optical Communication", IEEE Journal of Selected Topics in Quantum Electronics, vol. 4, No. 6, Nov./Dec. 1998, pp. 930–936.

B.J. Offrein, "Wavelength Tunable Optical Add–After–Drop Filter with Flat Passband for WDM Networks", IEEE Photonics Technology Letters, vol. 11, No. 2, Feb. 1999, pp. 239–241.

Hseih, S.W. et al: Characteristics of Low–Temperature and Low–Energy Plasma Enhanced Chemical Vapor Deposited SIO2, Aug. 1993, 2638–2648, vol. 74, No. 4, American Institute of Physics, Republic of China.

Kim, Kihong, et al.: Properties if Low Dielectric Constant Fluorinated Silicon Oxide Films Prepared by Plasma Enhanced Chemical Vapor Deposition, 1998, 369–374, Elsevier Science S.A., Baton Rouge, LA.

Grand, G. et al.: Low–Loss PECVD Silica Channel Waveguides For Optical Communications, Electronic Letters, Dec. 6, 1990, vol. 26, No. 25, France.

* cited by examiner

METHOD OF DEPOSITING OPTICAL FILMS

BACKGROUND OF THE INVENTION

1. Field of the Invention

This invention relates to optical films, an more particularly to a method of depositing optical quality silica films, for example, in the manufacture of waveguides for optical Mux/Demux devices.

2. Description of Related Art

Optical devices such as optical Multiplexers (Mux) and Demultiplexers (Dmux) require extremely transparent optical quality silica waveguides in the 1.30 bi-directional narrow optical band and/or in the 1.55 μm video signal optical band which the International Telecommunications Union (ITU) recommends for Wavelength Division Multiplexing (WDM) transport network and for optical access networks using Fiber-To-The-Home (FTTH) technology.

Such waveguides are discussed in, for example, Uchida N., Passively aligned hibrid WDM module integrated with spot-size converter integrated laser diode for fibre-to-the-home, Electronic Letters, 32 (18), 1996; Inoue Y., Silica-based planar lightwave circuits for WDM systems, IEICE Trans. Electron., E80C (5), 1997; Inoue Y., PLC hybrid integrated WDM transceiver module for access networks, NTT Review, 9 (6), 1997; and Takahashi H., Arrayed-waveguide grating wavelength multiplexers for WDM systems, NTT Review, 10 (1), 1998;

These silica waveguides are basically composed of three films: a buffer, a core and a cladding. For reasons of simplicity, the buffer and the cladding are typically of same composition and typically have the same characteristics, i.e., the same refractive index at 1.55 wavelength (or 1.30 μm wavelength). In order to confine the 1.55 μm wavelength (and/or 1.30 μm wavelength) laser beam, the core must have a higher refractive index than the buffer (cladding) at 1.55 wavelength (and/or 1.30 μm wavelength). The required difference of refractive index between the core and the buffer (cladding) at 1.55 wavelength (and/or 1.30 μm wavelength) is called the 'delta-n'. This 'delta-n' is one of the most important characteristics of silica waveguides. It is very difficult to fabricate optically transparent buffer (cladding) and core in the 1.55 μm wavelength (and/or 1.30 wavelength) optical region with a suitable 'delta-n'.

Various technical approaches to obtain these high performance optically transparent silica waveguides have been tried in the prior art. A first approach is to use Flame Hydrolysis Deposition (FHD). This technique involves the fusion in hydrogen, oxygen and other gases of fine glass particles followed by some post-deposition anneals to 1200–1350° C. A second approach is the High Pressure Steam (HPS) technique. This technique involves the direct growth of silica films from silicon under an oxygen containing ambient at very high temperature followed by a very high temperature anneal at about 1000° C. A third approach is the Electron-Beam Vapor Deposition (EBVD) technique of quartz or silica at about 350° C. followed by very high temperature anneals at 1200° C.

Another is approach is to use the Plasma Enhanced Chemical Vapour Deposition (PECVD) technique. Such a technique is described in the following documents: Low temperature plasma chemical vapor deposition of silicon oxynitride thin-film waveguides, Applied Optics, 23 (16), 2744, 1984; Valette S., New integrated optical multiplexer-demultiplexer realized on silicon substrate, ECIO '87, 145, 1987; Grand G., Low-loss PECVD silica channel waveguides for optical communications, Electron. Lett., 26 (25), 2135, 1990; Bruno F., Plasma-enhanced chemical vapor deposition of low-loss SiON optical waveguides at 1.5-μm wavelength, Applied Optics, 30 (31), 4560, 1991; Kasper K., Rapid deposition of high-quality silicon-oxynitride waveguides, IEEE Trans. Photonics Tech. Lett., 3 (12), 1096, 1991; Lai Q., Simple technologies for fabrication of low-loss silica waveguides, Elec. Lett., 28 (11), 1000, 1992; Bulat E. S., Fabrication of waveguides using low-temperature plasma processing techniques, J. Vac. Sci. Technol. A 11 (4), 1268, 1993; Imoto K., High refractive index difference and low loss optical waveguide fabricated by low temperature processes, Electron. Lett., 29 (12), 1123, 1993; Bazylenko M. V., Fabrication of low-temperature PECVD channel waveguides with significantly improved loss in the 1.50–1.55 μm wavelength range, IEEE Ptotonics Tech. Lett., 7 (7), 774, 1995; Liu K., Hybrid optoelectronic digitally tunable receiver, SPIE, Vol 2402, 104, 1995; Yokohama S., Optical waveguide on silicon chips, J. Vac. Sci. Technol. A, 13 (3), 629, 1995; Hoffmann M., Low temperature, nitrogen doped waveguides on silicon with small core dimensions fabricated by PECVD/RIE, ECIO'95, 299, 1995; Bazylenko M. V., Pure and fluorine-doped silica films deposited in a hollow cathode reactor for integrated optic applications, J. Vac. Sci. Technol. A 14 (2), 336, 1996; Durandet A., Silica burried channel waveguides fabricated at low temperature using PECVD, Electronics Letters, 32 (4), 326, 1996; Poenar D., Optical properties of thin film silicon-compatible materials, Appl. Opt. 36 (21), 5122, 1997; Agnihotri O. P., Silicon oxynitride waveguides for optoelectronic integrated circuits, Jpn. J. Appl. Phys., 36, 6711, 1997; Boswell R. W., Deposition of silicon dioxide films using the helicon diffusion reactor for integrated optics applications, Plasma processing of semiconductors, Klumer Academic Publishers, 433, 1997; Hoffmann M., Low-loss fiber-matched low-temperature PECVD waveguides with small-core dimensions for optical communication systems, IEEE Photonics Tech. Lett., 9 (9), 1238, 1997; Pereyra I., High quality low temperature DPECVD silicon dioxide, J. Non-Crystalline Solids, 212, 225, 1997; Kenyon T., A luminescence study of silicon-rich silica and rare-earth doped silicon-rich silica, Fourth Int. Symp. Quantum Confinement Electrochemical Society, 97–11, 304, 1997; Alayo M., Thick SiOxNy and SiO2 films obtained by PECVD technique at low temperatures, Thin Solid Films, 332,40, 1998; Bulla D., Deposition of thick TEOS PECVD silicon oxide films for integrated optical waveguide applications, Thin Solid Films, 334, 60, 1998; Canning J., Negative index gratings in germanosilica planar waveguides, Electron. Lett., 34 (4), 366, 1988; Valette S., State of the art of integrated optics technology at LETI for achieving passive optical components, J. of Modern Optics, 35 (6), 993, 1988; Ojha S., Simple method of fabricating polarization-insensitive and very low crosstalk AWG grating devices, Electron. Lett., 34 (1), 78, 1998; Johnson C., Thermal annealing of waveguides formed by ion implantation of silica-on-Si, Nuclear Instruments and Methods in Physics Research, B141, 670, 1998; Ridder R., Silicon oxynitride planar waveguiding structures for application in optical communication, IEEE J. of Sel. Top. In Quantum Electron., 4 (6), 930, 1998; Germann R., Silicon-oxynitride films for optical waveguide applications, 195$^{th}$ meeting of the Electrochemical Society, 99–1, May 1999, Abstract 137, 1999; Worhoff K., Plasma enhanced cyhemical vapor deposition silicon oxynitride optimized for application in integrated optics, Sensors and Actuators, 74, 9, 1999; and Offrein B., Wavelength tunable optical add-after-drop filter with flat passband for WDM networks, IEEE Photonics Tech. Lett., 11 (2), 239, 1999.

A comparison of these various PECVD techniques is summarised in the following table.

SUMMARY OF THE INVENTION

In its broad aspect present invention provides a method of depositing optical quality films by PECVD (Plasma Enhanced Chemical Vapour Deposition), comprising an optical film by PECVD (Plasma Enhanced Chemical Vapour

| Publication | PECVD Reaction | Refractive Index Control Method |
|---|---|---|
| Valette S., 1987 | Unknown | P doping |
| Valette S., 1988 | Unknown | P doping |
| Grand G., 1990 | Unknown | P doping |
| Liu K., 1995 | Unknown | Content in Si, P |
| Ojha S., 1998 | Unknown | Ge, B, or P doping |
| Canning J., 1998 | Unknown | Ge doping |
| Bulla D., 1998 | TEOS | TEOS |
| Johnson C., 1998 | $SiH_4 + O_2$ | Si ion Implantation |
| Bazylenko M. V., 1995 | $SiH_4 + O_2 + CF_4$ | $SiH_4/O_2/CF_4$ flow ratio |
| Bazylenko M. V., 1995 | $SiH_4 + O_2 + CF_4$ | $SiH_4/O_2/CF_4$ flow ratio |
| Bazylenko M. V., 1996 | $SiH_4 + O_2 + CF_4$ | $SiH_4/O_2/CF_4$ flow ratio |
| Durandet A., 1996 | $SiH_4 + O_2 + CF_4$ | $SiH_4/O_2/CF_4$ flow ratio |
| Boswell R. W., 1997 | $SiH_4 + O_2 + CF_4$ | $SiH_4/O_2/CF_4$ flow ratio |
| Kapser K., 1991 | $SiH_4 + N_2O$ | $SiH_4/N_2O$ flow ratio |
| Lai Q., 1992 | $SiH_4 + N_2O$ | $SiH_4/N_2O$ flow ratio |
| Pereyra I., 1997 | $SiH_4 + N_2O$ | $SiH_4/N_2O$ flow ratio |
| Alayo M., 1998 | $SiH_4 + N_2O$ | $SiH_4/N_2O$ flow ratio |
| Imoto K., 1993 | $SiH_4 + N_2O + N_2$ | $SiH_4/N_2O/N_2$ flow ratio |
| Kenyon T., 1997 | $SiH_4 + N_2O + Ar$ | $SiH_4/N_2O/Ar$ flow ratio |
| Lam D. K. W., 1984 | $SiH_4 + N_2O + NH_3$ | $SiH_4/N_2O/NH_3$ flow ratio |
| Bruno F., 1991 | $SiH_4 + N_2O + NH_3$ | $SiH_4/N_2O/NH_3$ flow ratio |
| Yokohama S., 1995 | $SiH_4 + N_2O + NH_3$ | $SiH_4/N_2O/NH_3$ flow ratio |
| Agnihotri O. P., 1997 | $SiH_4 + N_2O + NH_3$ | $SiH_4/N_2O/NH_3$ flow ratio |
| Germann R., 1999 | $SiH_4 + N_2O + NH_3$ | Unknown |
| Offrein B., 1999 | $SiH_4 + N_2O + NH_3$ | Unknown |
| Hoffmann M., 1995 | $SiH_4 + N_2O + NH_3 + Ar$ | $SiH_4/N_2O/NH_3/Ar$ flow ratio |
| Hoffmann M., 1997 | $SiH_4 + N_2O + NH_3 + Ar$ | $SiH_4/N_2O/NH_3/Ar$ flow ratio |
| Poenar D., 1997 | $SiH_4 + N_2O + NH_3 + N_2$ | $SiH_4/N_2O/NH_3/N_2$ flow ratio |
| Ridder R., 1998 | $SiH_4 + N_2O + NH_3 + N_2$ | $SiH_4/N_2O/NH_3/Ar$ flow ratio |
| Worhoff K., 1999 | $SiH_4 + N_2O + NH_3 + N_2$ | $SiH_4/N_2O/NH_3/N_2$ flow ratio |
| Bulat E.S., 1993 | $SiH_4 + N_2O + N_2 + O_4 + CF_4$ | $SiH_4/N_2O/N_2/O_2/CF_4$ flow ratio |
| This Patent Application | $SiH_4 + N_2O + PH_3 + N_2$ | Patented Method |

This table compares methods that have been tried to modify the refractive index of the buffer (cladding) and core while trying to reduce their optical absorption. The various techniques can be grouped into the following main categories: PECVD using unknown chemicals coupled with unknown boron (B) and/or phosphorus (P) chemicals to adjust the refractive index of the silica films; PECVD using TEOS coupled with unknown means of adjusting the refractive index of the silica films; PECVD using oxidation of $SiH_4$ with $O_2$ coupled with unknown means of adjusting the refractive index of the silica films; PECVD using oxidation of $SiH_4$ with $O_2$ coupled with $CF_4$ ($SiH_4/O_2/CF_4$ flow ratio) to adjust the refractive index of the silica films; PECVD using oxidation of $SiH_4$ with $N_2O$ coupled with $N_2O$ ($SiH_4/N_2O$ flow ratio) to adjust the refractive index of the silica films; PECVD using oxidation of $SiH_4$ with $N_2O$ coupled with $N_2O$ and $N_2$ ($SiH_4/N_2O/N_2$ flow ratio) to adjust the refractive index of the silica films; PECVD using oxidation of $SiH_4$ with $N_2O$ coupled with $N_2O$ and Ar ($SiH_4/N_2O/Ar$ flow ratio) to adjust the refractive index of the silica films; and PECVD using oxidation of $SiH_4$ with $N_2O$ coupled with $N_2O$ and $NH_3$ ($SiH_4/N_2O/NH_3$ flow ratio) to adjust the refractive index of the silica films.

None of these prior art techniques satisfactorily addresses the problem of achieving high quality films with the ability to create the desired difference in refractive index between adjacent films, for example, forming the core and cladding layers of an optical waveguide.

Deposition) in the presence of reactive gases; and controlling the flow rate of at least one of said reactive gases to achieve the desired difference in refractive indices (delta n).

Typically the optical film is silica. The reactive gas is normally $PH_3$, but it can also be, for example, diborane, $B_2H_6$, Arsine ($AsH_3$), Titanium hydride, $TiH_4$ or germane, $GeH_4$, Silicon Tetrafluoride, $SiF_4$ of carbon tetrafluoride, $CF_4$.

The invention can be used for the fabrication of silica waveguides using the PECVD technique. Independent control of the reactive gases, such as $SiH_4$, $N_2O$, $N_2$ and $PH_3$, as well as of the total deposition pressure is carried out via an automatic control of the pumping speed of the vacuum pump in a six-dimensional space. This includes, in a preferred embodiment, as a first independent variable, the $SiH_4$ flow; as second independent variable, the $N_2O$ flow; as a third independent variable, the $N_2$ flow; as a fourth independent variable, the $PH_3$ flow; as a fifth independent variable; the total deposition pressure (controlled by an automatic adjustment of the pumping speed); and as sixth independent variable the observed waveguide characteristics.

The present inventors have shown that the variation of the $PH_3$ flow rate while maintaining the other variables constant is a key factor in achieving the required different in refractive index, 'delta-n', while still eliminating undesirable residual Si:N—H oscillators (observed as a FTIR peak centered at 3380 $cm^{-1}$) after thermal treatment at low post-deposition temperature. The invention permits the production of improved silica waveguides with reduced optical absorption in the 1.55 μm wavelength (and/or 1.30 wavelength) optical region and allows the fabrication of high performance optical quality Multiplexers (Mux) and Demultiplexers (Dmux) with improved performances in the 1.55 μm wavelength video signal optical band (and/or in the 1.30 μm wavelength bi-directional narrow optical band).

The invention can be implemented using a commercially available PECVD system, the "Concept One" system manufactured by Novellus Systems of California, USA.

Our co-pending U.S. patent application Ser. No. 09/833,711 filed on Apr. 13, 2001 shows the surprising effect of the fourth independent variable, the total deposition pressure, on the optimization of the optical properties of various buffers (claddings), in a five-dimensional space. In this case, the five-dimensional space consists of a first independent variable, the $SiH_4$ gas flow, typically fixed at 0.20 std litre/min; a second independent variable, the $N_2O$ gas flow, tyipcaliy fixed at 6.00 std litre/min; a third independent variable, the $N_2$ gas flow, typically fixed at 3.15 std litre/min; a fourth independent variable, the total deposition pressure, which is varied; and a fifth dimension being provided by he observed FTIR characteristics of various buffers (claddings), as reported in: FIG. 1a, FIG. 2a, FIG. 4a, FIG. 5a, FIG. 6a and FIG. 7a. As reported in this application the the total deposition pressure can be set at 2.00 Torr; 2.10 Torr; 2.20 Torr; 2.30 Torr; 2.40 Torr; 2.50 Torr; or 2.60 Torr.

The present invention is based on the surprising effect the fifth independent variable, the phosphine, $PH_3$, gas flow, has on the simultaneous optimization of the optical properties of the various buffers (claddings) and cores in a six-dimensional space.

In accordance with the principles of the invention, typically the first independent variable, the $SiH_4$ gas flow, is fixed at 0.20 std litre/min; the second independent variable, the $N_2O$ gas flow, is fixed at 6.00 std litre/min; and the third independent variable, the $N_2$ gas flow, is fixed at 3.15 std litre/min.

The fourth independent variable, the $PH_3$ gas flow, is varied and can take one of the following values: 0.00 std litre/min; 0.12 std litre/min; 0.25 std litre/min; 0.35 std litre/min; 0.50 std litre/min; 0.65 std litre/min;

The fifth independent variable, the total deposition pressure, is typically fixed at 2.60 Torr; and the sixth dimension is provided the observed FTIR characteristics of various cores, as illustrated in: FIG. 1b, FIG. 2b, FIG. 3, FIG. 4b, FIG. 5b, FIG. 6b, and FIG. 7b.

This new technique is key to achieving the required 'delta-n' while eliminating the undesirable residual Si:N-H oscillators (observed as a FTIR peak centered at 3380 $cm^{-1}$) after thermal treatment at low post-deposition temperature. It permits the production of improved silica waveguides with reduced optical absorption in the 1.55 μm wavelength (and/or 1.30 wavelength) optical region and allows the fabrication of high performance optical quality Multiplexers (Mux) and Demultiplexers (Dmux) with improved performances in the 1.55 μm wavelength video signal optical band (and/or in the 1.30 μm wavelength bi-directional narrow optical band).

The invention also provides a method of depositing optical quality films by PECVD (Plasma Enhanced Chemical Vapour Deposition), comprising creating a six-dimensional space wherein five dimensions thereof correspond to five respective independent variables of which a set of four independent variables relate to the flow-rate of respective gases, a fifth independent variable relates to total pressure, and a six dimension relates to observed FTIR characteristics; and depositing an optical film while maintaining three of said set of four independent variables substantially constant as well as said fifth independent variable, and varying a fourth of said set of four independent variables to obtain desired characteristics in said sixth dimension.

BRIEF DESCRIPTION OF THE DRAWINGS

The invention will now be described in more detail, by way of example only, with reference to the accompanying drawings, in which.

DETAILED DESCRIPTION OF THE PREFERRED EMBODIMENTS

The Effect of the $PH_3$ Gas Flow on the FTIR Characteristics of Various Cores

Figure 1A:
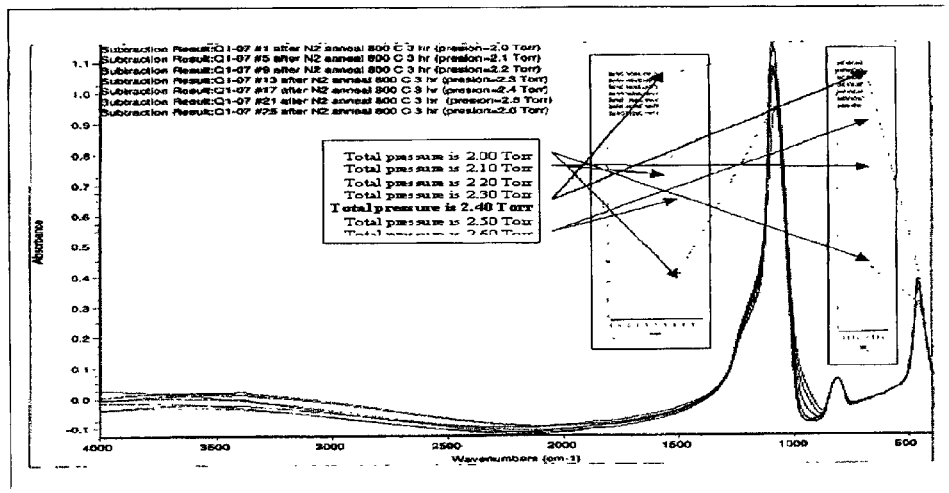
FIG. 1a shows the basic FTIR spectra of various Buffers (Clads) obtained with the PECVD deposition technique described in our pending patent application after a three hours long high temperature thermal treatment in a nitrogen ambient at a low temperature of 800° C.

The basic FTIR spectra of various buffers (claddings) obtained with the PECVD deposition technique described in our co-pending patent application and after a three-hour long high temperature thermal treatment in a nitrogen ambient at a low temperature of 800° C. are shown in FIG. 1a. This shows a gradually more intense and smaller FWHM Si—O—Si "rocking mode" absorption peak (between 410 and 510 cm$^{-1}$) as the deposition pressure is increased from 2.00 Torr to 2.40 Torr and then a gradually less intense and larger FWHM Si—O—Si "rocking mode" absorption peak as the pressure is further increased from 2.40 Torr to 2.60 Torr; a gradually more intense and smaller FWHM Si—O—Si "in-phase-stretching mode" absorption peak (between 1000 and 1160 cm$^{-1}$) indicating a much more stoichiometric silica films with the optimum density and optimum Si—O—Si bond angle of 144°) as the deposition pressure is increased from 2.00 Torr to 2.40 Torr and then a gradually less intense and FWHM Si—O—Si "in-phase-stretching mode" absorption as the pressure is further increased from 2.40 Torr to 2.60 Torr; and a gradually more evident separation between the Si—O—Si "in-phase-stretching mode" absorption peak (1080 cm$^{-1}$) and the Si—O—Si "bending mode" absorption peak (810 cm$^{-1}$) with a gradually deeper valley between 850 and 1000 cm$^{-1}$ as the deposition pressure is increased from 2.00 Torr to 2.40 Torr and then a gradually less evident separation and a gradually less deep valley between 850 and 1000 cm$^{-1}$ as the pressure is further increased from 2.40 Torr to 2.60 Torr.

Figure 1B:
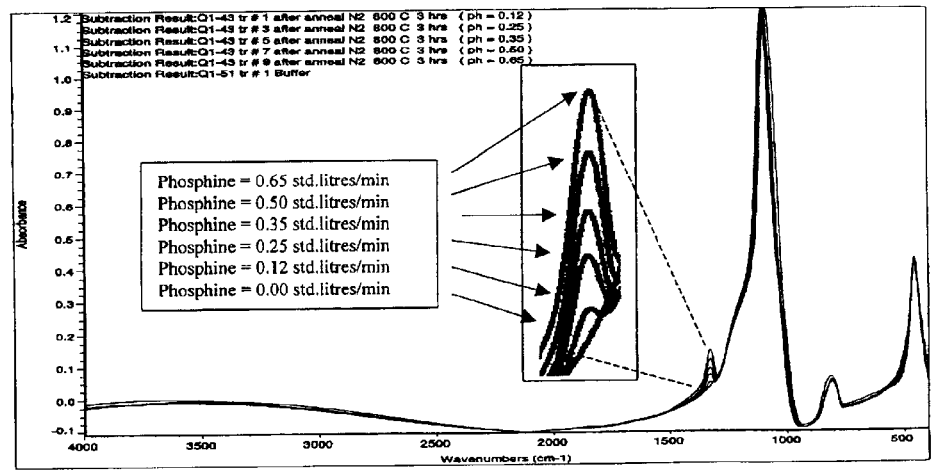
FIG. 1b shows the basic FTIR spectra of various Cores obtained at 2.60 Torr with the new PECVD deposition technique after a three hours long high temperature thermal treatment in a nitrogen ambient at a low temperature of 800° C.

FIG. 1b shows the basic FTIR spectra of various cores obtained the PECVD deposition technique in accordance with the principles of the invention and after a three-hour long high temperature thermal treatment in a nitrogen ambient at a low temperature of 800° C. At a fixed deposition pressure of 2.60 Torr, the control of the $PH_3$ gas flow independently of the $SiH_4$ gas flow, of the $N_2O$ gas flow and of the $N_2$ gas flow has no effect on the basic FTIR spectra of the treated silica films.

The intense and small FWHM Si—O—Si "rocking mode" absorption peak (between 410 and 510 cm$^{-1}$) of the fixed deposition pressure of 2.60 Torr of FIG. 1a is maintained in FIG. 1b as the $PH_3$ flow rate is gradually increased from 0.00 std litre/min to 0.65 std litre/min.

The intense and small FWHM Si—O—Si "in-phase-stretching mode" absorption peak (between 1000 and 1160 cm$^{-1}$) of the fixed deposition pressure of 2.60 Torr of FIG. 1a is maintained in FIG. 1b as the $PH_3$ flow rate is gradually increased from 0.00 std litre/min to 0.65 std litre/min;

The separation between the Si—O—Si "in-phase-stretching mode" absorption peak (1080 cm$^{-1}$) and the Si—O—Si "bending mode" absorption peak (810 cm$^{-1}$) with a deep valley between 850 and 1000 cm$^{-1}$ of the fixed deposition pressure of 2.60 Torr of FIG. 1a is maintained in FIG. 1b as the $PH_3$ flow rate is gradually increased from 0.00 std litre/min to 0.65 std litre/min.

The 810 to 1000cm$^{-1}$ FTIR Spectra

Figure 2A:
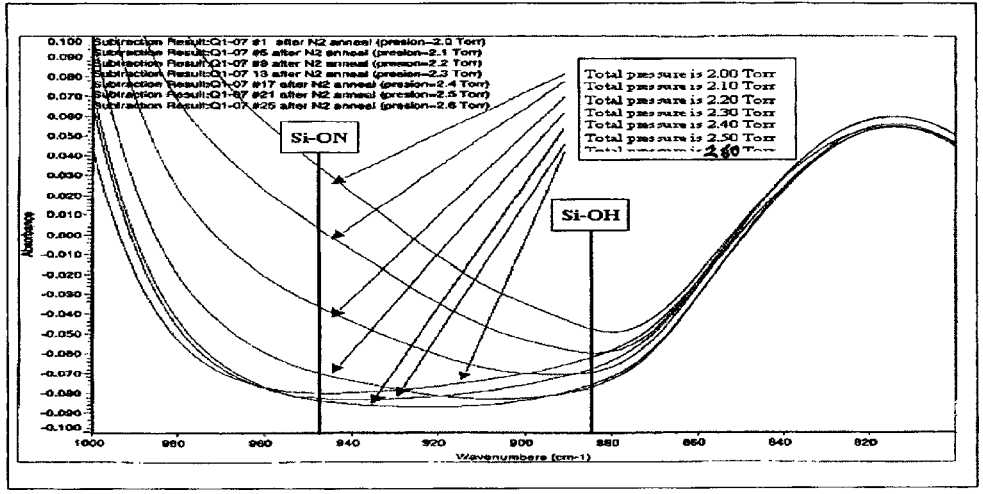
FIG. 2a shows the in-depth FTIR spectra from 810 to 1000 $cm^{-1}$ of various Buffers (Clads) obtained with the PECVD deposition technique described in our other pending patent application and after a three hours long high temperature thermal treatment in a nitrogen ambient at a low temperature of 800° C.

FIG. 2a shows the in-depth FTIR spectra from 810 to 1000 cm$^{-1}$ of various buffers (claddings) obtained with the PECVD deposition technique described in our co-pending patent application and after a three-hour long high temperature thermal treatment in a nitrogen ambient at a low temperature of 800° C. This shows a gradually better elimination of the residual Si—OH oscillators (centered at 885 cm$^{-1}$) as the deposition pressure is increased from 2.00 Torr to 2.40 Torr and then a gradually worse elimination as the pressure is further increased from 2.40 Torr to 2.60 Torr; a gradually better elimination of the Si—ON oscillators (centered at 950 cm$^{-1}$) of the residual SiONH and/or SiON$_2$ post-treatment compounds as the deposition pressure is increased from 2.00 Torr to 2.40 Torr and then gradually worse elimination as the deposition pressure is further increased from 2.40 Torr to 2.60 Torr; and a gradually deeper valley between the Si—O—Si "in-phase-stretching mode" absorption peak (1080 cm$^{-1}$) and the Si—O—Si "bending mode" absorption peak (810 cm$^{-1}$) as the deposition pressure is increased from 2.00 Torr to 2.40 Torr and then a gradually less deeper valley as the deposition pressure is further increased from 2.40 Torr to 2.60 Torr.

Figure 2B:
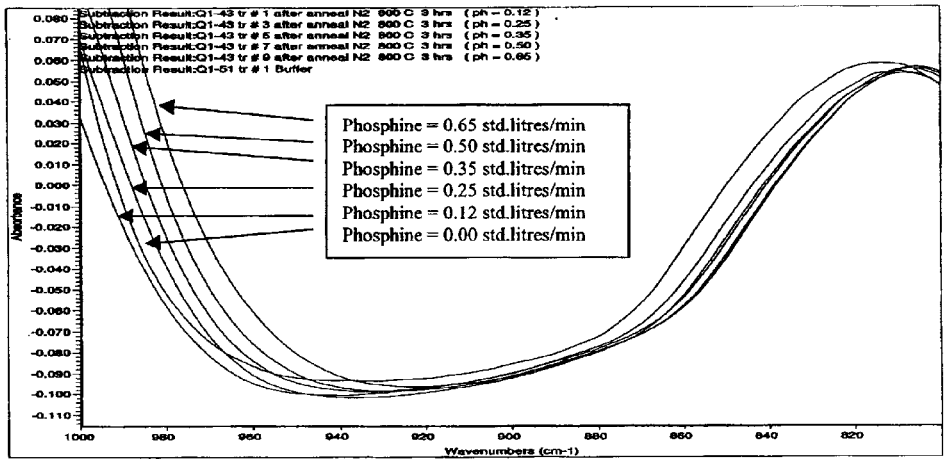
FIG. 2b shows the in-depth FTIR spectra from 810 to 1000 $cm^{-1}$ of various Cores obtained at 2.60 Torr with the new PECVD deposition technique after a three hours long high temperature thermal treatment in a nitrogen ambient at a low temperature of 800° C.

FIG. 2b shows the in-depth FTIR spectra from 810 to 1000 cm$^{-1}$ of various Cores obtained with the following new PECVD deposition technique and after a three hours long high temperature thermal treatment in a nitrogen ambient at a low temperature of 800° C. At a fixed deposition pressure of 2.60 Torr, the control of the PH$_3$ gas flow independently of the SiH$_4$ gas flow, of the N$_2$O gas flow and of the N$_2$ gas flow has a slight positive effect on the 810 to 1000cm$^{-1}$ FTIR spectra of the treated silica films:

The elimination of the residual Si—OH oscillators (centered at 885 cm$^{-1}$) of the fixed deposition pressure of 2.60 Torr of FIG. 3a is maintained and in fact slightly improved as the PH$_3$ flow rate is gradually increased from 0.00 std litre/min to 0.65 std litre/min.

The elimination of the Si—ON oscillators (centered at 950 cm$^{-1}$) of the residual SiONH and/or SiON$_2$ post-treatment compounds of the fixed deposition pressure of 2.60 Torr of FIG. 3a is maintained and in fact slightly improved as the PH$_3$ flow rate is gradually increased from 0.00 std litre/min to 0.65 std litre/min.

The deep valley between the Si—O—Si "in-phase-stretching mode" absorption peak (1080 cm$^{-1}$) and the Si—O—Si "bending mode" absorption peak (810 cm$^{-1}$) of the fixed deposition pressure of 2.60 Torr of FIG. 3a is maintained and in fact slightly improved as the PH$_3$ flow rate is gradually increased from 0.00 std litre/min to 0.65 std litre/min.

The 1200 to 1500cm$^{-1}$ FTIR Spectra

Figure 3:
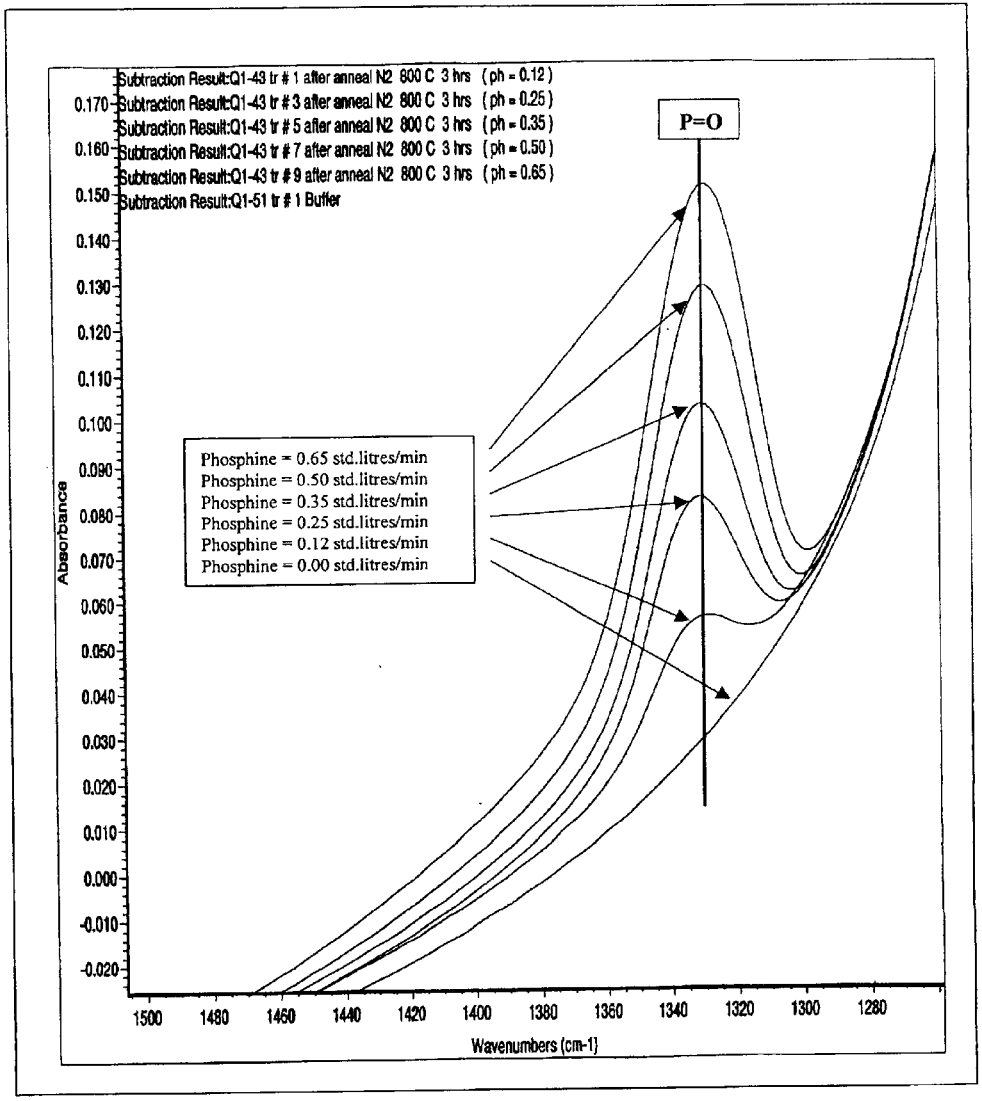
FIG. 3 shows the in-depth FTIR spectra from 1260 to 1500 $cm^{-1}$ of various Cores obtained at 2.60 Torr with the new PECVD deposition technique after a three hours long high temperature thermal treatment in a nitrogen ambient at a low temperature of 800° C.

FIG. 3 shows the in-depth FTIR spectra from 1200 to 1500 cm$^{-1}$ of various cores obtained with the following new PECVD deposition technique and after a three hour-long high temperature thermal treatment in a nitrogen ambient at a low temperature of 800° C. At a fixed deposition pressure of 2.60 Torr, the control of the PH$_3$ gas flow independently of the SiH$_4$ gas flow, of the N$_2$O gas flow and of the N$_2$ gas flow has a direct effect on the 1200 to 1500cm$^{-1}$ FTIR spectra of the treated silica films.

The P=O oscillators (centered at 1330 cm$^{-1}$ and which do not have a higher harmonics which could cause optical absorption in the 1.30 to 1.55 μm optical bands) effectively increase as the PH$_3$ flow rates is increased from 0.00 std litre/min to 0.65 std litre/min. This FTIR absorption peak can be used to calibrate the phosphorus incorporation in the Core.

The 1500 to 1600cm$^{-1}$ FTIR Spectra

Figure 4A:
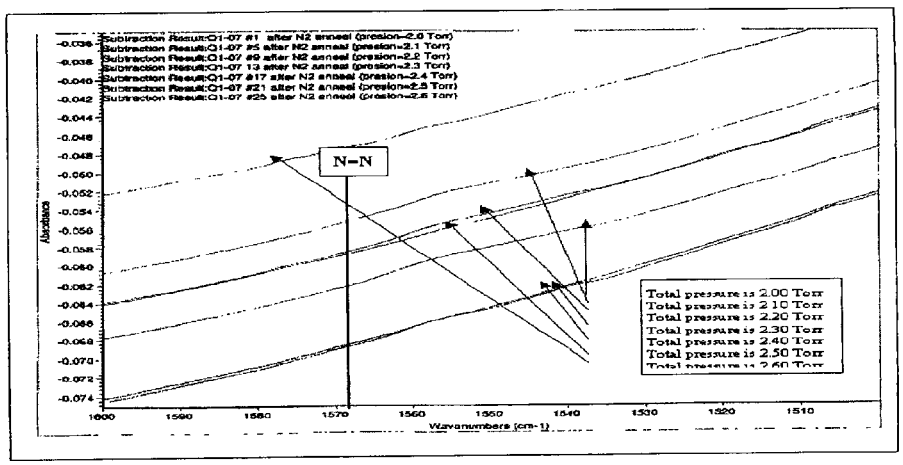
FIG. 4a shows the in-depth FTIR spectra from 1500 to 1600 $cm^{-1}$ of various buffers (claddings) obtained with the PECVD deposition technique described in our co-pending patent application and after a three hours long high temperature thermal treatment in a nitrogen ambient at a low temperature of 800° C.

FIG. 4a shows the in-depth FTIR spectra from 1500 to 1600 cm$^{-1}$ of various Buffers (Claddings) obtained with the PECVD deposition technique described in our co-pending patent application and after a three-hour long high temperature thermal treatment in a nitrogen ambient at a low temperature of 800° C. This shows that the N=N oscillators are eliminated for all deposition pressures from 2.00 Torr to 2.60 Torr.

Figure 4B:
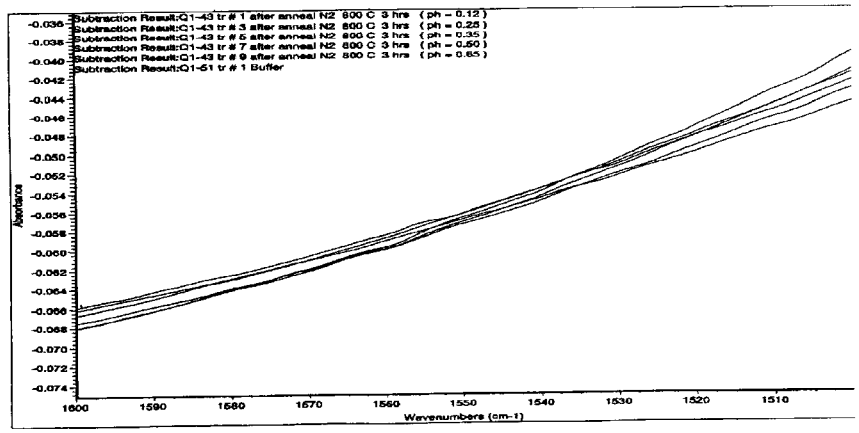
FIG. 4b shows the in-depth FTIR spectra from 1500 to 1600 $cm^{-1}$ of various Cores obtained at 2.60 Torr with the new PECVD deposition technique after a three hours long high temperature thermal treatment in a nitrogen ambient at a low temperature of 800° C.

FIG. 4b shows the in-depth FTIR spectra from 1500 to 1600 cm$^{-1}$ of various cores obtained with the PECVD deposition technique in accordance with the principles of the invention and after a three-hour long high temperature thermal treatment in a nitrogen ambient at a low temperature of 800° C. At a fixed deposition pressure of 2.60 Torr, the control of the PH$_3$ gas flow independently of the SiH$_4$ gas flow, of the N$_2$O gas flow and of the N$_2$ gas flow has no effect on the 1500 to 1600cm$^{-1}$ FTIR spectra of the treated silica films.

The N=N oscillators are also eliminated for all PH$_3$ flow rates from 0.00 std litre/min to 0.65 std litre/min.

The 1700 to 2200cm$^{-1}$ FTIR Spectra

Figure 5A:
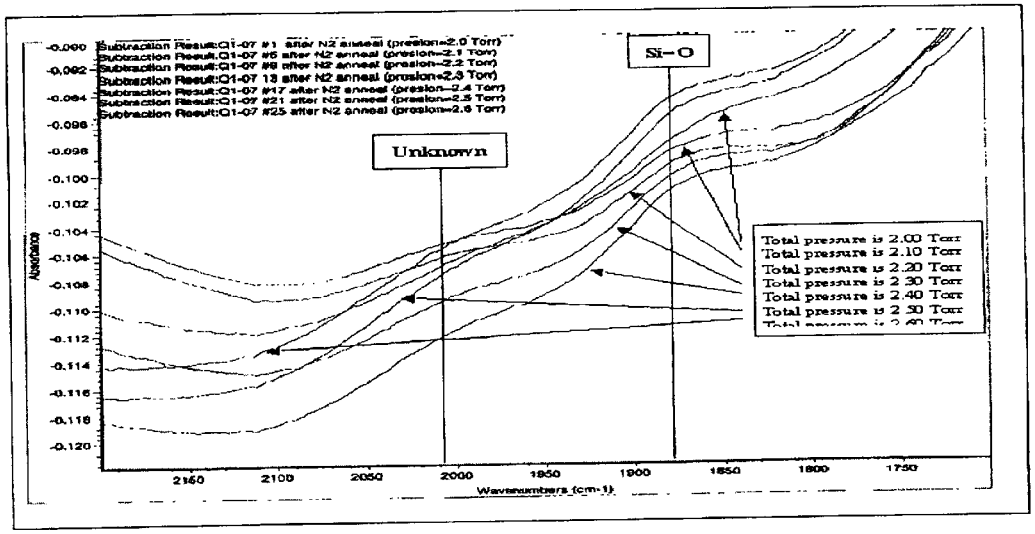
FIG. 5a shows the in-depth FTIR spectra from 1700 to 2200 $cm^{-1}$ of various Buffers (Clads) obtained with the PECVD deposition technique described in our other pending patent application and after a three hours long high temperature thermal treatment in a nitrogen ambient at a low temperature of 800° C.

FIG. 5a shows the in-depth FTIR spectra from 1700 to 2200 cm$^{-1}$ of various Buffers (Claddings) obtained with the PECVD deposition technique described in our other pending patent application and after a three hours long high temperature thermal treatment in a nitrogen ambient at a low temperature of 800° C.

The Si=O oscillators (centered at 1875 cm$^{-1}$ land whose fourth harmonics could cause an optical absorption between 1.282 and 1.389 μm) and on the unknown oscillator (centered at 2010 cm$^{-1}$ and which does not have a higher harmonics which could cause optical absorption in the 1.30 to 1.55 μm optical bands) are not affected by any of the deposition pressures from 2.00 Torr to 2.60 Torr. This limitation is not that important since only the fourth harmonics of the Si=O oscillators which can absorb in the 1.30 to 1.55 μm optical bands.

Figure 5B:
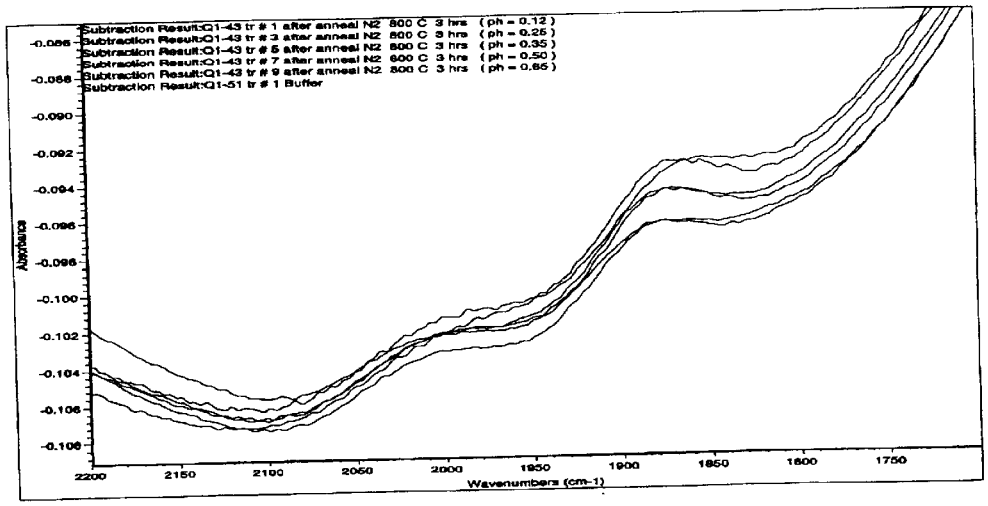
FIG. 5b shows the in-depth FTIR spectra from 1700 to 2200 $cm^{-1}$ of various Cores obtained at 2.60 Torr with the new PECVD deposition technique after a three hours long high temperature thermal treatment in a nitrogen ambient at a low temperature of 800° C.

FIG. 5b shows the in-depth FTIR spectra from 1700 to 2200 cm$^{-1}$ of various cores obtained with the PECVD deposition technique in accordance with the principles of the invention and after a three-hour long high temperature thermal treatment in a nitrogen ambient at a low temperature of 800° C. At a fixed deposition pressure of 2.60 Torr, the control of the PH$_3$ gas flow independently of the SiH$_4$ gas flow, of the N$_2$O gas flow and of the N$_2$ gas flow has no effect on the 1700 to 2200cm$^{-1}$ FTIR spectra of the treated silica films.

The Si=O oscillators (centered at 1875 cm$^{-1}$ land whose fourth harmonics could cause an optical absorption between 1.282 and 1.389 μm) and on the unknown oscillator (centered at 2010 cm$^{-1}$ and which does not have a higher harmonics which could cause optical absorption in the 1.30 to 1.55 μm optical bands) are not affected by any of all PH$_3$ flow rates from 0.00 std litre/min to 0.65 std litre/min. This limitation is not that important since only the fourth harmonics of the Si=O oscillators which can absorb in the 1.30 to 1.55 μm optical bands.

The 2200 to 2400cm$^{-1}$ FTIR Spectra

Figure 6A:
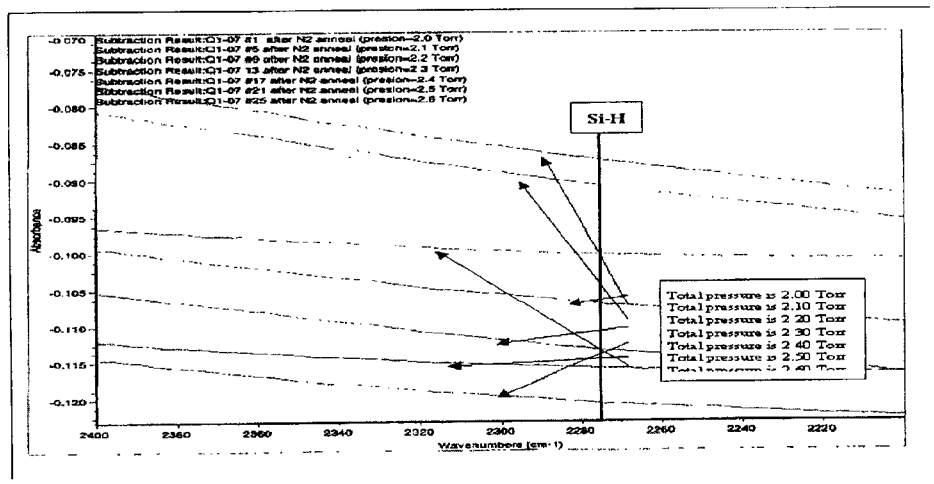
FIG. 6a shows the in-depth FTIR spectra from 2200 to 2400 $cm^{-1}$ various buffers (claddings) obtained with the PECVD deposition technique described in our other pending patent application and after a three hours long high temperature thermal treatment in a nitrogen ambient at a low temperature of 800° C.

FIG. 6a shows the in-depth FTIR spectra from 2200 to 2400 cm$^{-1}$ of various buffers (claddings) obtained with the PECVD deposition technique described in our co-pending patent application and after a three-hour long high temperature thermal treatment in a nitrogen ambient at a low temperature of 800° C.

The Si—H oscillators (centered at 2260 cm$^{-1}$ and whose third harmonics could cause an optical absorption between 1.443 and 1.508 μm) are completely eliminated for all of the deposition pressures from 2.00 Torr to 2.60 Torr.

Figure 6B:
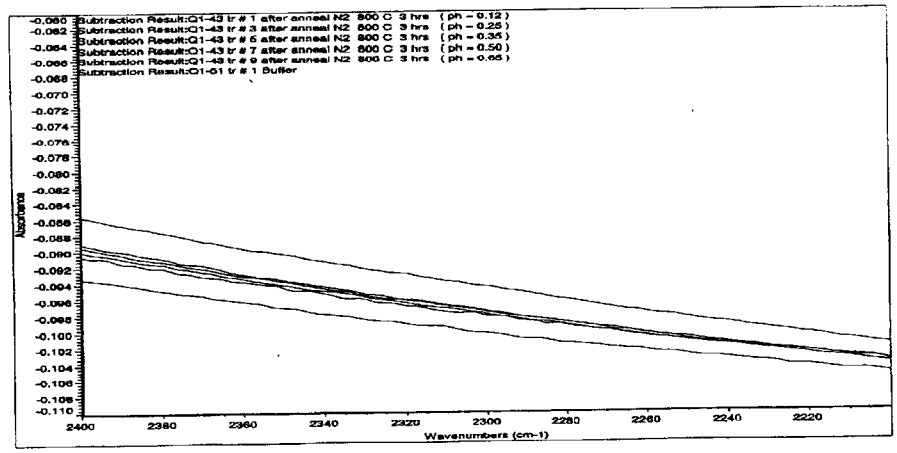
FIG. 6b shows the in-depth FTIR spectra from 2200 to 2400 cm$^{-1}$ of various Cores obtained at 2.60 Torr with the new PECVD deposition technique after a three hours long high temperature thermal treatment in a nitrogen ambient at a low temperature of 800° C.

FIG. 6b shows the in-depth FTIR spectra from 2200 to 2400 cm$^{-1}$ of various cores obtained with the PECVD deposition technique in accordance with the principles of the invention and after a three-hour long high temperature thermal treatment in a nitrogen ambient at a low temperature of 800° C. At a fixed deposition pressure of 2.60 Torr, the control of the $PH_3$ gas flow independently of the $SiH_4$ gas flow, of the $N_2O$ gas flow and of the $N_2$ gas flow has no effect on the 2200 to 2400$cm^{-1}$ FTIR spectra of the treated silica films.

The Si—H oscillators (centered at 2260 $cm^{-1}$ and whose third harmonics could cause an optical absorption between 1.443 and 1.508 $\mu$m) are still completely eliminated by any of all $PH_3$ flow rates from 0.00 std litre/min to 0.65 std litre/min.

The 3200 to 3900$cm^{-1}$ FTIR Spectra

Figure 7A:
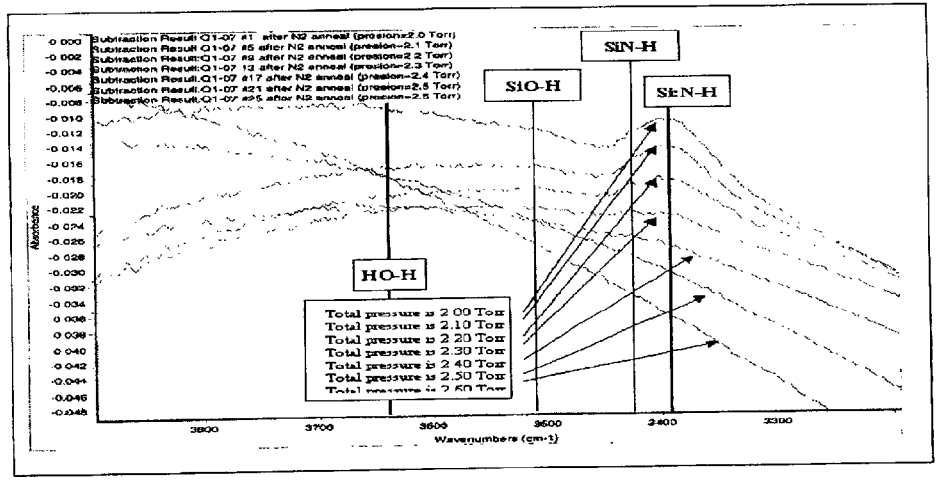
FIG. 7a show the in-depth FTIR spectra from 3200 to 3900 cm$^{-1}$ of various buffers (claddings) obtained with the PECVD deposition technique described in our other pending patent application and after a three hours long high temperature thermal treatment in a nitrogen ambient at a low temperature of 800° C.

FIG. 7a shows the in-depth FTIR spectra from 3200 to 3900 $cm^{-1}$ of various buffers (bladdings) obtained with the PECVD deposition technique described in our co-pending patent application and after a three-hour long high temperature thermal treatment in a nitrogen ambient at a low temperature of 800° C.

The HO—H oscillators (centered at 3650 $cm^{-1}$, showing trapped water vapour in the micro-pores of the silica films and whose second harmonics could cause an optical absorption between 1.333 and 1.408 $\mu$m) are completely eliminated for all of the deposition pressures from 2.00 Torr to 2.60 Torr.

The SiO—H oscillators (centered at 3510 $cm^{-1}$ and whose second harmonics could cause an optical absorption between 1.408 and 1.441 $\mu$m) are completely eliminated for all of the deposition pressures from 2.00 Torr to 2.60 Torr.

The SiN—H oscillators (centered at 3420 $cm^{-1}$ and whose second harmonics could cause an optical absorption between 1.445 and 1.479 $\mu$m) are gradually eliminated as the deposition pressure is increased from 2.00 Torr to 2.60 Torr.

The Si:N—H oscillators (centered at 3380 $cm^{-1}$ and whose second harmonics could cause an optical absorption between 1.445 and 1.515 $\mu$m) are gradually eliminated as the deposition pressure is increased from 2.00 Torr to 2.60 Torr. This spectacular complete elimination at such a low thermal treatment temperature of only 800° C. is really significant because it requires the thermal breaking two covalent bonds binding the nitrogen atom to the silicon atom of the $SiO_2$ network. It is to be concluded that the increase of deposition pressure from 2.00 Torr to 2.60 Torr minimizes the formation of such residual Si:N—H oscillators with two covalent bonds.

Figure 7B:
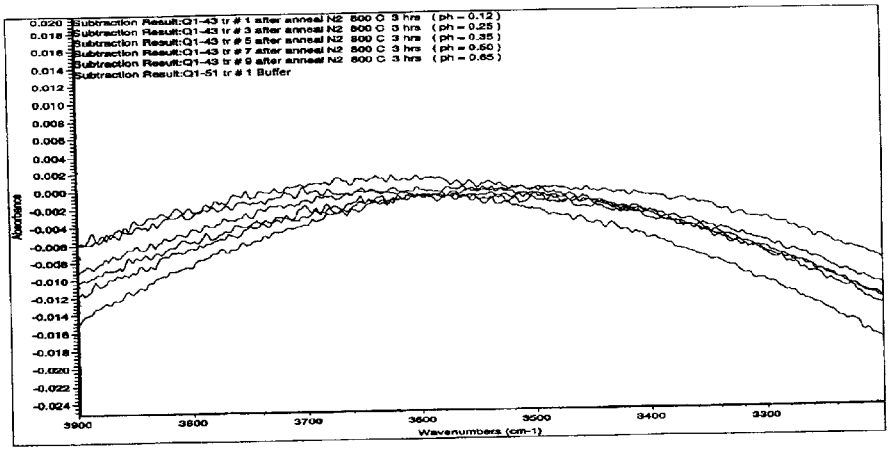
FIG. 7b shows the in-depth FTIR spectra from 3200 to 3900 cm$^{-1}$ of various Cores obtained at 2.60 Torr with the new PECVD deposition technique after a three hours long high temperature thermal treatment in a nitrogen ambient at a low temperature of 800° C.

FIG. 7b shows the in-depth FTIR spectra from 3200 to 3900 $cm^{-1}$ of various Cores obtained with the following new PECVD deposition technique and after a three-hour long high temperature thermal treatment in a nitrogen ambient at a low temperature of 800° C. At a fixed deposition pressure of 2.60 Torr, the control of the $PH_3$ gas flow independently of the $SiH_4$ gas flow, of the $N_2O$ gas flow and of the $N_2$ gas flow has no effect on the 2200 to 2400$cm^{-1}$ FTIR spectra of the treated silica films.

The HO—H oscillators (centered at 3650 $cm^{-1}$, showing trapped water vapour in the micro-pores of the silica films and which second harmonics could cause an optical absorption between 1.333 and 1.408 $\mu$m) are still completely eliminated by any of all $PH_3$ flow rates from 0.00 std litre/min to 0.65 std litre/min.

The SiO—H oscillators (centered at 3510 $cm^{-1}$ and whose second harmonics could cause an optical absorption between 1.408 and 1.441 $\mu$m) are still completely eliminated by any of all $PH_3$ flow rates from 0.00 std litre/min to 0.65 std litre/min.

The SiN—H oscillators (centered at 3420 $cm^{-1}$ and whose second harmonics could cause an optical absorption between 1.445 and 1.479 $\mu$m) are still completely eliminated by any of all $PH_3$ flow rates from 0.00 std litre/min to 0.65 std litre/min;

The Si:N—H oscillators (centered at 3380 $cm^{-1}$ and which second harmonics could cause an optical absorption between 1.445 and 1.515 $\mu$m are still completely eliminated by any of all $PH_3$ flow rates from 0.00 std litre/min to 0.65 std litre/min. This complete elimination at such a low thermal treatment temperature of only 800° C. is really spectacular because it requires thermally breaking two covalent bonds binding the nitrogen atom to the silicon atom of the $SiO_2$ network. It is to be concluded that at this deposition pressure of 2.60 Torr the increase of $PH_3$ flow rate from 0.00 std litre/min to 0.65 std litre/min still minimizes the formation of such residual Si:N—H oscillators with two covalent bonds.

The Potential Effect of the $PH_3$ Gas Flow on Optical Absorption in the 1.30 to 1.55 $\mu$m Optical Bands The various FTIR spectra show that, at a fixed pressure of 2.60 Torr, the control of the $PH_3$ gas flow, independently of the other deposition variables in this six-dimensional space, should have no effect on the optical absorption in the 1.55 $\mu$m wavelength (and/or 1.30 wavelength) optical region.

FIG. 1b shows that $PH_3$ gas flow has no effect on: the Si—O—Si "rocking mode" (460 $cm^{-1}$) and Si—O—Si "in-phase-stretching mode" (1080 $cm^{-1}$) oscillators;

FIG. 2b shows that $PH_3$ gas flow has a slight positive effect on: the Si—O—Si "bending mode" oscillator (810 $cm^{-1}$); on the Si—OH oscillator (centered at 885 $cm^{-1}$); on the Si—ON oscillator (centered at 950 $cm^{-1}$) and; on the Si—O—Si "in-phase-stretching mode" oscillator (1080 $cm^{-1}$). The observed positive effects on these four oscillators should have no effect on the optical absorption of the various Cores in the 1.55 $\mu$m wavelength (and/or 1.30 wavelength) optical region because optical absorption in the 1.30–1.55 $\mu$m optical band is only possible by the very high harmonics of these oscillators: the $8^{th}$ vibration harmonics of the Si—O—Si "bending mode" oscillator; the $8^{th}$ vibration harmonics of the Si—OH oscillator; the $7^{th}$ vibration harmonics of the Si—ON oscillator and; the $6^{th}$ vibration harmonics of the Si—O—Si "in-phase-stretching mode" oscillator;

FIG. 3 shows that $PH_3$ gas flow has a very direct effect on the P=O oscillator (1330 $cm^{-1}$) which does not have a higher harmonics which could cause optical absorption in the 1.30–1.55 $\mu$m optical band.

FIG. 4b shows that $PH_3$ gas flow has no effect on the N=N oscillator (1555 $cm^{-1}$).

FIG. 5b shows that $PH_3$ gas flow has no effect on the Si=O oscillator (1875 $cm^{-1}$) or on the the unknown oscillator (2010 $cm^{-1}$).

FIG. 6b shows that $PH_3$ gas flow has no effect on the Si—H oscillator (2260 $cm^{-1}$).

FIG. 7b shows that $PH_3$ gas flow has no effect on: the HO—H oscillator (3650 $cm^{-1}$); the SiO—H oscillator (3510 $cm^{-1}$); the SiN—H oscillator (3420 $cm^{-1}$) and; the Si:N—H oscillator (3380 $cm^{-1}$).

Figure 8A:
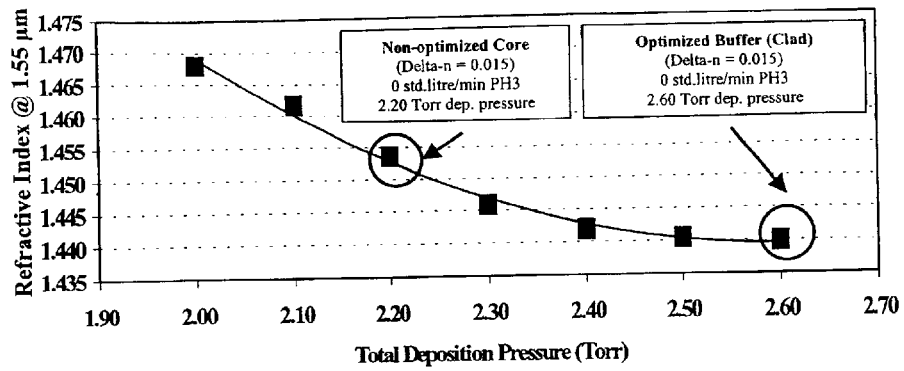
FIG. 8a shows the effect of the total deposition pressure on the 1.55 μm TE mode refractive index of various Buffers (Clads) and Cores deposited at a fixed $SiH_4$ gas flow of 0.20 std litre/min, a fixed $N_2O$ gas flow of 6.00 std litre/min, a fixed $N_2$ gas flow of 3.15 std litre/min and following a thermal treatment in a nitrogen ambient at 800° C.

The Effect of the Total Deposition Pressure and of the $PH_3$ Gas Flow on the 1.55 $\mu$m TE Mode Refractive Index FIG. 8a shows the effect of the total deposition pressure on the 1.55 $\mu$m Transversal Electric (TE) mode refractive index of various buffers (claddings) and cores deposited at a fixed $SiH_4$ gas flow of 0.20 std litre/min, a fixed $N_2O$ gas flow of 6.00 std litre/min, a fixed $N_2$ gas flow of 3.15 std litre/min and following a thermal treatment in a nitrogen ambient at 800° C. As noted in our co-pending patent application, it is clear that the introduction of the fourth independent variable, the total deposition pressure, is critical for the development of optimized optical buffers (claddings) and cores and that the control of this parameter is of prime importance for the repeatable achievement of high quality optical buffers (claddings) and cores. At this point it should be repeated that typical vacuum pumping systems used in PECVD equipment (i.e. rotary vane mechanical pumps, roots blowers, turbo-molecular pumps or others) suffer from many sources of pumping speed variation over time (variation of the AC electrical power source, variation of the pumping conductance due to accumulation of residues in the protection scrubber or pumping lines etc.).

It might thus be expected that a PECVD deposition condition involving a fixed set of gas flow parameters would suffer from a non-repeatability of the 1.55 μm TE mode refractive index. In order to achieve the required 'delta-n' of 0.015, FIG. 8a shows that one possible way to achieve the required 'delta-n' is to associate to the optically transparent optimized buffer of refractive index 1.440, deposited at 2.60 Torr with no $PH_3$ gas flow, and a core of refractive index 1.455, deposited at about 2.20 Torr with no $PH_3$ gas flow.

Figure 8B:
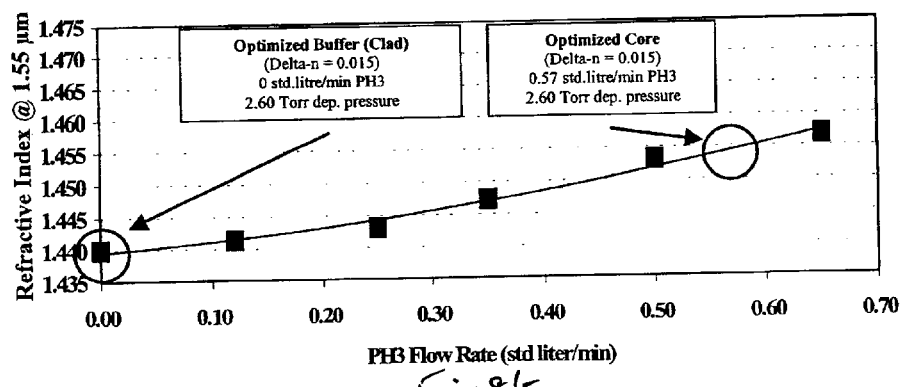
FIG. 8b shows the effect of the PH3 flow rate on the 1.55 μm TE mode refractive index of various Buffers (Clads) and Cores deposited at a fixed $SiH_4$ gas flow of 0.20 std litre/min, a fixed $N_2O$ gas flow of 6.00 std litre/min, a fixed $N_2$ gas flow of 3.15 std litre/min, a fixed deposition pressure of 2.60 Torr and following a thermal treatment in a nitrogen ambient at 800° C.

FIG. 8b shows the effect of the $PH_3$ gas flow on the 1.55 μm TE mode refractive index of various buffers (claddings) and cores deposited at a fixed $SiH_4$ gas flow of 0.20 std litre/min, a fixed $N_2O$ gas flow of 6.00 std litre/min, a fixed $N_2$ gas flow of 3.15 std litre/min, a fixed deposition pressure of 2.60 Torr and following a thermal treatment in a nitrogen ambient at 800° C.

In order to get the required 'delta-n' of 0.015, this FIG. 8b shows that another possible way to achieve the required 'delta-n' is to associate to the optically transparent Optimized Buffer of refractive index 1.440, deposited at 2.60 Torr with no $PH_3$ gas flow, a Core of refractive index 1.455, deposited at 2.60 Torr with about 0.57 std litre/min of $PH_3$ gas flow.

Figure 9A:
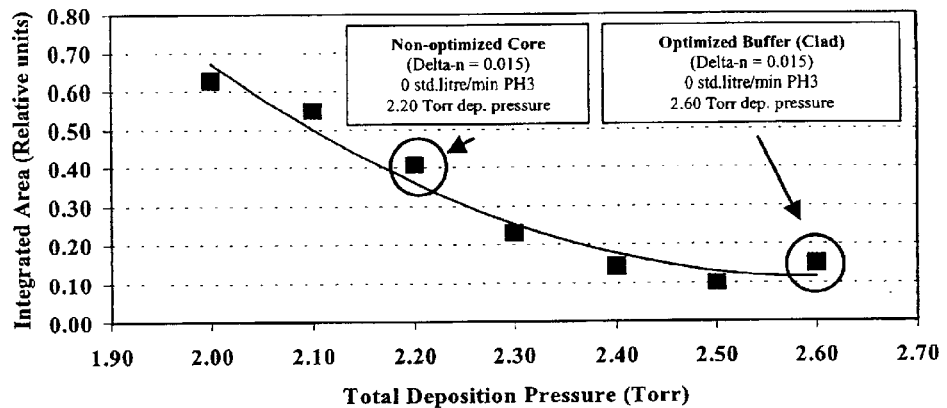
FIG. 9a shows the effect of the total deposition pressure on the integrated area under the 3380 cm$^{-1}$ FTIR peak of the Si:N—H oscillators of various Buffers (claddings) and cores deposited at a fixed $SiH_4$ gas flow of 0.20 std litre/min, at a fixed $N_2O$ gas flow of 6.00 std litre/min, at a fixed $N_2$ gas flow of 3.15 std litre/min and following a thermal treatment in a nitrogen ambient at 800° C.

The Integrated Area Under the 3380cm$^{-1}$ Si:H—H Oscillator of the FTIR Spectra FIG. 9a shows the spectacular effect of the total deposition pressure on the integrated area under the 3380 cm$^{-1}$ FTIR peak of the Si:N—H oscillators of various buffers (claddings) and cores deposited at a fixed $SiH_4$ gas flow of 0.20 std litre/min, at a fixed $N_2O$ gas flow of 6.00 std litre/min, at a fixed $N_2$ gas flow of 3.15 std litre/min and following a thermal treatment in a nitrogen ambient at 800° C. The integrated area under the 3380 cm$^{-1}$ FTIR peak is a non-calibrated relative measurement of the number of residual this Si:N—H oscillators bonded to the $SiO_2$ network by two covalent Si—N bonds.

It is clear that the elimination of the residual Si:N—H oscillators, whose $2^{nd}$ vibration harmonics cause an optical absorption between 1.445 and 1.515 μm, is gradually more complete as the deposition pressure is increased from 2.00 Torr to 2.60 Torr (after a low thermal treatment temperature of only 800° C.). It is clear that the possible core of FIG. 9a (refractive index 1.455, deposited at about 2.20 Torr with no $PH_3$ gas flow) is associated with an excessive number of undesirable residual Si:N—H oscillators whose $2^{nd}$ vibration harmonics cause an optical absorption between 1.445 and 1.515 μm.

Figure 9B:
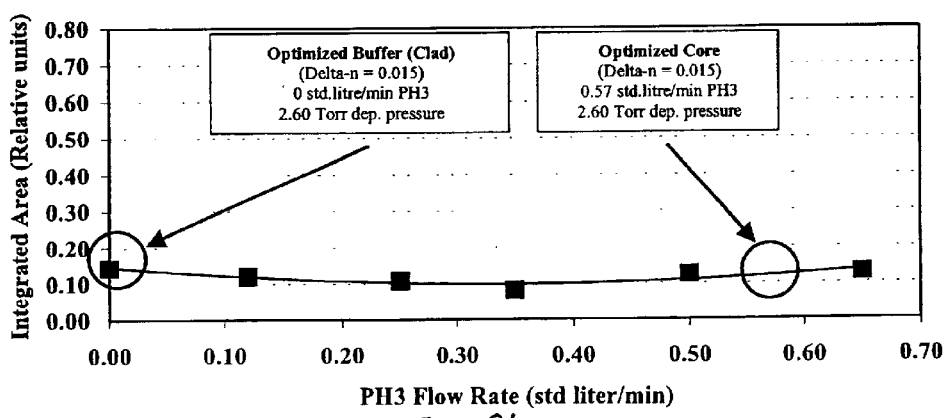
FIG. 9b shows the effect of the PH3 flow rate on the integrated area under the 3380 cm$^{-1}$ FTIR peak of the Si:N—H oscillators of various Buffers (Clads) and Cores deposited at a fixed $SiH_4$ gas flow of 0.20 std litre/min, at a fixed $N_2O$ gas flow of 6.00 std litre/min, at a fixed $N_2$ gas flow of 3.15 std litre/min, at a fixed deposition pressure of 2.60 Torr and following a thermal treatment in a nitrogen ambient at 800° C.

FIG. 9b shows the effect of the $PH_3$ gas flow on the integrated area under the 3380 cm$^{-1}$ FTIR peak of the Si:N—H oscillators of various buffers (claddings) and cores deposited at a fixed $SiH_4$ gas flow of 0.20 std litre/min, at a fixed $N_2O$ gas flow of 6.00 std litre/min, at a fixed $N_2$ gas flow of 3.15 std litre/min, at a fixed deposition pressure of 2.60 Torr and following a thermal treatment in a nitrogen ambient at 800° C. The integrated area under the 3380 cm$^{-1}$ FTIR peak is almost independent of the $PH_3$ gas flow meaning that the elimination of the residual Si:N—H oscillators, whose $2^{nd}$ vibration harmonics cause an optical absorption between 1.445 and 1.515 μm, is independent of the $PH_3$ gas flow (after a low thermal treatment temperature of only 800° C.).

It is clear that to the core of FIG. 8b (refractive index 1.455, deposited at 2.60 Torr with about 0.57 std litre/min of $PH_3$ gas flow) is associated with a negligible number of undesirable residual Si:N—H oscillators whose $2^{nd}$ vibration harmonics cause an optical absorption between 1.445 and 1.515 μm.

Figure 10A:
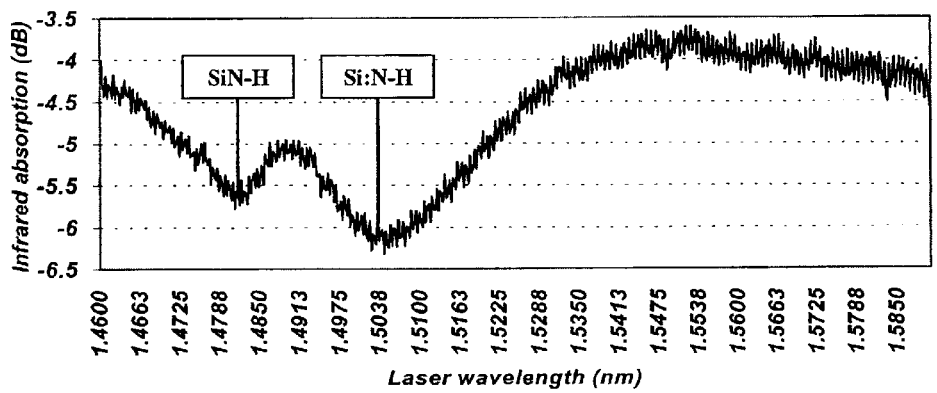
FIG. 10a shows the infrared optical absorption spectra of PECVD silica waveguides obtained with: The Optimized Buffer (Clad) ($SiH_4$=0.20 std litre/min; $N_2O$=6.00 std litre/min; N2=3.15 std litre/min; $PH_3$=0.00 std litre/min; deposition pressure=2.60 Torr) and the Non-optimized Core ($SiH_4$=0.20 std litre/min; $N_2O$=6.00 std litre/min; N2=3.15 std litre/min; $PH_3$=0.00 std litre/min; deposition pressure= 2.20 Torr) following a thermal treatment in a nitrogen ambient at 800° C.

The Effect of the $PH_3$ Gas Flow on the Optical Absorption of Various Waveguides FIG. 10a shows the infrared optical absorption spectra of PECVD silica waveguides obtained with: the Optimized buffer (cladding) ($SiH_4$=0.20 std litre/min; $N_2O$=6.00 std litre/min; N2=3.15 std litre/min; $PH_3$=0.00 std litre/min; deposition pressure =2.60 Torr) and the Non-optimized core ($SiH_4$=0.20 std litre/min; $N_2$=6.00 std litre/min; N2=3.15 std litre/min; $PH_3$=0.00 std litre/min; deposition pressure =2.20 Torr) following a thermal treatment in a nitrogen ambient at 800° C. As predicted by the upper-discussed FTIR spectra, it is clear that this waveguide of 'delta-n' of 0.015 is associated with many residual Si:H—H oscillators (and the residual SiN—H oscillators) which cause excessive optical absorption between 1.445 and 1.515 μm.

Figure 10B:
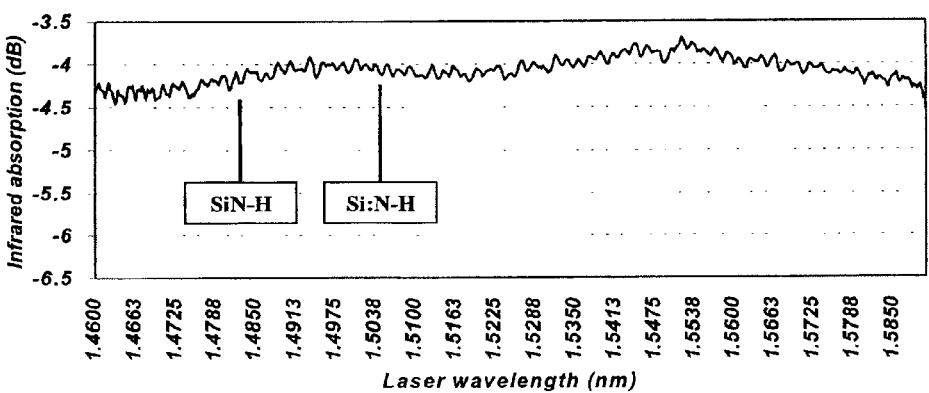
FIG. 10b shows the infrared optical absorption spectra of PECVD silica waveguides obtained with: The Optimized Buffer (Clad) ($SiH_4$=0.20 std litre/min; $N_2O$=6.00 std litre/min; N2=3.15 std litre/min; $PH_3$=0.00 std litre/min; deposition pressure=2.60 Torr) and Optimized Core ($SiH_4$=0.20 std litre/min; $N_2O$=6.00 std litre/min; N2=3.15 std litre/min; $PH_3$=0.57 std litre/min; deposition pressure =2.60 Torr) following a thermal treatment in a nitrogen ambient at 800° C.

FIG. 10b shows the infrared optical absorption spectra of PECVD silica waveguides obtained with: the Optimized buffer (cladding) ($SiH_4$=0.20 std litre/min; $N_2O$=6.00 std litre/min; N2=3.15 std litre/min; $PH_3$=0.00 std litre/min; deposition pressure =2.60 Torr) and the Optimized core ($SiH_4$=0.20 std litre/min; $N_2O$=6.00 std litre/min; N2=3.15 std litre/min; $PH_3$=0.57 std litre/min; deposition pressure =2.60 Torr) following a thermal treatment in a nitrogen ambient at 800° C. As predicted by the upper-discussed FTIR spectra, it is clear that this second waveguide of 'delta-n' of 0.015 is associated with a negligible number of residual Si:H—H oscillators (and the residual SiN—H oscillators) which cause negligible optical absorption between 1.445 and 1.515 μm.

In summary, the above examples show the important role that the fifth independent variable, the phosphine, $PH_3$, gas flow, plays on the simultaneous optimization of the optical properties of the various buffers (claddings) and cores in a six-dimensional space. In a preferred embodiment, the first independent variable, the $SiH_4$ gas flow, is fixed at 0.20 std litre/min; the second independent variable, the $N_2O$ gas flow, is fixed at 6.00 std litre/min; the third independent variable, the $N_2$ gas flow, is fixed at 3.15 std litre/min; and the fourth independent variable, the $PH_3$ gas flow, is varied and selected from the following values: 0.00 std litre/min; 0.12 std litre/min; 0.25 std litre/min; 0.35 std litre/min; 0.50 std litre/min; 0.65 std litre/min.

The fifth independent variable, the total deposition pressure, is fixed at 2.60 Torr. The sixth dimension is the observed FTIR characteristics of various cores, as reported in: FIG. 1b, FIG. 2b, FIG. 3, FIG. 4b, FIG. 5b, FIG. 6b, and FIG. 7b.

As demonstrated, the above-described technique permits the required 'delta-n' to be achieved while eliminating the undesirable residual SI:N—H oscillators (observed as a FTIR peak centered at 3380 cm$^{-1}$) after thermal treatment at low post-deposition temperature to provide improved silica waveguides with reduced optical absorption in the 1.55 μm wavelength (and/or 1.30 wavelength) optical region and to allow the fabrication of high performance optical quality Multiplexers (Mux) and Demultiplexers (Dmux) with improved performances in the 1.55 μm wavelength video signal optical band (and/or in the 1.30 μm wavelength bi-directional narrow optical band).

The comparison of the various PECVD approaches summarised in FIG. 1 and of our co-pending patent application shows that the proposed PECVD approach for the achievement of the buffers (claddings) is unique in that it uses an independent control of the $SiH_4$, $N_2O$ and $N_2$ gases as well as of the total deposition pressure via an automatic control of the pumping speed of the vacuum pump in a five-dimensional space to improve the elimination of undesirable $Si—O_xH_y-N_2$ compounds due to an improved elimination of $N_2$, $O_2$, HNO, $NH_3$, $H_2O$, and $H_2O$ gaseous compounds that must be eliminated from the micro-pores of the growing silica films up to their surface and from their surface through the gaseous boundary layer present near their surface. This effect is due to the fact that the equilibrium is affected by a modification of the number of gaseous compounds; i.e. the number of gaseous product compound molecules is different than three, the number of gaseous reactant compound molecules:

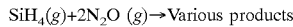

$SiH_4(g) + 2N_2O(g) \rightarrow$ Various products

The various references cited in the above table use: $SiH_4/N_2O$ gas flow ratios in a two-dimensional space (a unique independent variable, the $SiH_4/N_2O$ ratio, and the observed variable, the observed characteristics); $SiH_4/N_2O/N_2$ gas flow ratios in a three-dimensional space (a first independent variable, the $SiH_4/N_2O$ ratio, a second independent variable, $N_2O/N_2$ ratio, and the observed variable, the observed characteristics); $SiH_4$, $N_2O$, $N_2$ gas flows in a four-dimensional space (a first independent variable, the $SiH_4$ flow, a second independent variable, the $N_2O$ flow, a third independent variable the $N_2$ flow, and the observed variable, the observed characteristics);

In accordance with the principles of the present invention, the spectacular effect of a fifth independent variable, the phosphine, $PH_3$, gas flow, on the simultaneous optimization of the optical properties of the various is clearly demonstrated by the FTIR spectra of various deposited cores in a six-dimensional space.

In one specific example the first independent variable, the $SiH_4$ gas flow, is fixed at 0.20 std litre/min; the second independent variable, the $N_2O$ gas flow, is fixed at 6.00 std litre/min; the third independent variable, the $N_2$ gas flow, is fixed at 3.15 std litre/min; the fourth independent variable, the $PH_3$ gas flow, is varied among the following values: 0.00 std litre/min, 0.12 std litre/min, 0.25 std litre/min, 0.35 std litre/min, 0.50 std litre/min, and 0.65 std litre/min; the fifth independent variable, the total deposition pressure, is fixed at 2.60 Torr; and the sixth dimension forming part of the six-dimensional space is the observed FTIR characteristics of various Cores, as reported in: FIG. 1b, FIG. 2b, FIG. 3, FIG. 4b, FIG. 5b, FIG. 6b, and FIG. 7b which show that, at a fixed pressure of 2.60 Torr, the control of the $PH_3$ gas flow, independently of the other deposition variables in this six-dimensional space, should have no effect on the optical absorption in the 1.55 μm wavelength (and/or 1.30 wavelength) optical region.

In order to achieve the required 'delta-n' of 0.015 (TE mode at 1.55 μm) between the buffer (cladding) and the core of the waveguides, FIG. 8a shows that a first waveguide option would be the association of the optically transparent optimized buffer of refractive index 1.440 (deposited at a fixed $SiH_4$ gas flow of 0.20 std litre/min, at a fixed $N_2O$ gas flow of 6.00 std litre/min, at a fixed $N_2$ gas flow of 3.15 std litre/min, at a fixed $PH_3$ gas flow of 0.00 std litre/min, at a fixed pressure of 2.60 Torr and following a thermal treatment in a nitrogen ambient at 800° C.) and of a core of refractive index 1.455 deposited at a fixed $SiH_4$ gas flow of 0.20 std litre/min, at a fixed $N_2O$ gas flow of 6.00 std litre/min, at a fixed $N_2$ gas flow of 3.15 std litre/min, at a fixed $PH_3$gas flow of 0.00 std litre/min, at a fixed pressure of 2.20 Torr and following a thermal treatment in a nitrogen ambient at 800° C.

Unfortunately, FIG. 9a shows that to this first Core option is associated an important integrated area under the 3380 cm$^{-1}$ FTIR peak of the Si:N—H oscillators bonded to the $SiO_2$ network by two covalent Si—N bonds and, because the $2^{nd}$ vibration harmonics of these Si:N—H oscillators will cause an optical absorption between 1.445 and 1.515 μm, FIG. 9a predicts that the optical properties of the waveguides that result from this first Core option would not be satisfactory. FIG. 10a confirms that to this first core option is associated excessive infrared optical absorption associated to an excessive number of residual Si:H—H oscillators (and residual SiN—H oscillators) causing excessive optical absorption between 1.445 and 1.515 μm.

An alternative option to get the required 'delta-n' of 0.015 (TE mode at 1.55 μm) between the buffer (cladding) and the core of the waveguides is shown in FIG. 9b. This figure shows that it is possible to still associate to the optically transparent optimized buffer of refractive index 1.440 (deposited at a fixed $SiH_4$ gas flow of 0.20 std litre/min, at a fixed $N_2O$ gas flow of 6.00 std litre/min, at a fixed $N_2$ gas flow of 3.15 std litre/min, at a fixed $PH_3$ gas flow of 0.00 std litre/min, at a fixed pressure of 2.60 Torr and following a thermal treatment in a nitrogen ambient at 800° C.) an optimized core of refractive index 1.455 deposited at a fixed $SiH_4$ gas flow of 0.20 std litre/min, at a fixed $N_2O$ gas flow of 6.00 std litre/min, at a fixed $N_2$ gas flow of 3.15 std litre/min, at a fixed $PH_3$gas flow of 0.57 std litre/min, at a fixed pressure of 2.60 Torr and following a thermal treatment in a nitrogen ambient at 800° C. In this case, FIG. 9b shows that to this optimized core option is associated a much reduced integrated area under the 3380 cm$^{-1}$ FTIR peak of the residual Si:N—H oscillators, which $2^{nd}$ vibration harmonics cause an optical absorption between 1.445 and 1.515 μm, and that this integrated area is almost independent of the $PH_3$ gas flow (after a low thermal treatment temperature of only 800° C.). FIG. 9b then predicts that the optical properties of the waveguides that result from this optimized Core option would be excellent. FIG. 10b confirms that this optimized core option is associated with an excellent optical transparency resulting from a negligible number of residual Si:H—H oscillators (and the residual SiN—H oscillators).

This novel technique permits the required 'delta-n' to be achieved while eliminating the undesirable residual Si:N—H oscillators after thermal treatments at low post-deposition temperature as to provide improved silica waveguides with reduced optical absorption in the 1.55 μm wavelength (and/or 1.30 wavelength) optical region and as to allow the fabrication of high performance optical quality Multiplexers (Mux) and Demultiplexers (Dmux) with improved performances in the 1.55 μm wavelength video signal optical band (and/or in the 1.30 μm wavelength bi-directional narrow optical band).

As will be understood by one skilled in the art, many variations of the invention are possible. By way of non-limiting example, the PECVD silica films could be deposited at a temperature different than 400° C., and in particular at any temperature between 100 and 650° C.

The PECVD equipment could be different from the Novellus Concept One. The basic requirement is to provide independent control of the four basic control parameters: $SiH_4$ gas flow rate, $N_2O$ gas flow rate, $N_2$ gas flow rate and total deposition pressure.

The buffer (cladding) local optimum ($SiH_4$ gas flow of 0.20 std litre/min, $N_2O$ gas flow of 6.00 std litre/min, $N_2$ gas flow of 3.15 std litre/min and a total deposition pressure of 2.60 Torr) is this four-independent-variables space could have a different set of coordinates ($SiH_4$, $N_2O$, $N_2$, deposition pressure) using the same Novellus Concept One equipment.

The buffer (cladding) local optimum could have a different set of coordinates ($SiH_4$, $N_2O$, $N_2$, deposition pressure) in another PECVD equipment. The core local optimum ($SiH_4$ gas flow of 0.20 std litre/min, $N_2O$ gas flow of 6.00 std litre/min, $N_2$ gas flow of 3.15 std litre/min, $PH_3$ gas flow of 0.57 std litre/min, and a total deposition pressure of 2.60 Torr) in this five-independent-variables space could have a different set of coordinates ($SiH_4$, $N_2O$, $N_2$, $PH_3$, deposition pressure) using the same Novellus Concept One equipment. The core local optimum could have a different set of coordinates ($SiH_4$, $N_2O$, $N_2$, $PH_3$, deposition pressure) in another PECVD equipment.

The 'delta-n' could be different than 0.015 and range between 0.005 and 0.020. The $SiH_4$ silicon raw material gas could be replaced by an alternate silicon containing gas, such as: silicon tetra-chloride, $SiCl_4$, silicon tetra-fluoride, $SiF_4$, disilane, $Si_2H_6$, dichloro-silane, $SiH_2Cl_2$, chloro-fluoro-silane $SiCl_2F_2$, difluoro-silane $SiH_2F_2$ or any other silicon containing gases involving the use of hydrogen, H, chlorine, Cl, fluorine, F, bromine, Br, and iodine, I.

The $N_2O$ oxidation gas could be replaced by an alternate oxygen containing gas, such as: oxygen, $O_2$, nitric oxide, $NO_2$, water, $H_2O$, hydrogen peroxide, $H_2O_2$, carbon monoxide, CO or carbon dioxide, $CO_2$.

The $N_2$ carrier gas could be replaced by an alternate carrier gas, such as: helium, He, neon, Ne, argon, Ar or krypton, Kr.

The $PH_3$ doping gas could be replaced by an alternate gas, such as: diborane, $B_2H_6$, Arsine ($AsH_3$), Titanium hydride, $TiH_4$ or germane, $GeH_4$, Silicon Tetrafluoride, $SiF_4$ of carbon tetrafluoride, $CF_4$.

The high temperature thermal treatment in nitrogen can be performed at a temperature different than 800° C. The preferred range is from 400 to 1200° C.

The optical region of interest is not limited to the 1.30 to 1.55 $\mu$m optical region since the higher oscillation harmonics of the eliminated oscillators have other optical benefits at longer or shorter wavelengths. The wavelengths of the first, second, third and fourth harmonics of these oscillators are to be covered by this patent.

The invention finds application is various other manufacturing processes involving the use of high quality silica films, such as Other Photonics devices than Mux/Dmux devices; semiconductor devices; Micro Electro Mechanical Systems (MEMS); Bio-chips; Lab-on-a-chip devices; and Multi-chip modules.

Although the present invention has been described and illustrated in detail, it is clearly understood that the same is by way of illustration and example only and is not to be taken by way of limitation, the spirit and scope of the invention being limited only by the terms of the appended claims.

We claim:

1. A method of making silica waveguides, comprising:
   depositing optical films by PECVD (Plasma Enhanced Chemical Vapour Deposition) in the presence of a silicon-containing gas, an oxidation gas, a carrier gas, and $PH_3$ as a doping gas, said optical films having refractive indices differing by an amount delta-n;
   setting a total pressure of said gases and flow rates of said silicon-containing gas, said oxidation gas, and said carrier gas at constant values to minimize absorption peaks in FTIR spectra; and
   adjusting the flow rate of said doping gas while maintaining said total pressure and said flow rates at constant values to achieve a target value for said delta-n without changing the FTIR spectra.

2. A method as claimed in claim 1, wherein said silicon-containing gas is $SiH_4$, said oxidation gas is $N_2O$, and said carrier gas is $N_2$.

3. A method as claimed in claim 2, wherein the $SiH_4$ gas flow is fixed at about 0.20 std litre/min; the $N_2O$ gas flow is fixed at about 6.00 std litre/min; the $N_2$ gas flow is fixed at 3.15 std litre/min; and the $PH_3$ gas flow, is varied among the following values: 0.00 std litre/min; 0.12 std litre/min; 0.25 std litre/min; 0.35 std litre/min; 0.50 std litre/min; and 0.65 std litre/min.

4. A method as claimed in claim 3, wherein the total deposition pressure is fixed at about 2.60 Torr.

5. A method as claimed in claim 1, further comprising subjecting the films to a post deposition thermal treatment.

6. A method as claimed in claim 5, wherein said post thermal treatment takes place at a temperature between 400 and 1200° C.

7. A method as claimed in claim 6, wherein said thermal treatment takes place at about 800° C.

8. A method as claimed in claim 7, wherein said thermal treatment takes place in the presence of nitrogen.

9. A method as claimed in claim 1, wherein said films are deposited at a temperature between 100 and 650° C.

10. A method as claimed in claim 9, wherein said films are deposited at a temperature of about 400° C.

11. A method of making silica waveguides, comprising:
    defining a six-dimensional space wherein five dimensions thereof correspond to first, second, third, fourth, and fifth respective independent variables, of which said first, second, third, and fourth independent variables relate respectively to the flow-rate of a raw material gas, an oxidation gas, a carrier gas, and a doping gas, and said fifth independent variable relates to total pressure, and a sixth dimension relates to observed FTIR characteristics;
    depositing optical quality films having refractive indices differing by an amount delta-n by PECVD (Plasma Enhanced Chemical Vapour Deposition) while maintaining said first, second, third and fifth independent variables constant at values selected to optimized said observed FTIR characteristics; and
    varying said fourth independent variable to obtain the desired delta-n without changing said observed FTIR characteristic; and
    wherein said doping gas is selected from the group consisting of $PH_3$; $B_2H_6$; $AsH_3$; $TiH_4$; $GeH_4$; $SiF_4$; and $CF_4$.

12. A method as claimed in claim 11, wherein said optical films are silica films.

13. A method as claimed in claim 12, wherein said raw material gas is selected from the group consisting of: $SiH_4$; $SiCl_4$; $SiF_4$; $Si_2H_6$; $SiH_2Cl_2$; $SiCl_2F_2$; $SiH_2F_2$.

14. A method as claimed in claim 13, wherein said oxidation gas is selected from the group consisting of $N_2O$; $O_2$; $NO_2$; $H_2O$; $H_2O_2$; CO; $CO_2$.

15. A method as claimed in claim 14, wherein said carrier gas is selected from the group consisting of $N_2$; He; Ne; Ar; and Kr.

16. A method as claimed in claim 11, further comprising carrying out a post-deposition thermal treatment at a temperature between 400 and 1200° C.

17. A method as claimed in claim 16, wherein said post-deposition treatment is carried out in the presence of nitrogen.

18. A method as claimed in claim 16, wherein said post-deposition treatment is carried out at a temperature of about 800° C.

19. A method as claimed in claim 11, wherein the raw material gas flow is fixed at about 0.20 std litre/min; the oxidation gas flow is fixed at about 6.00 std litre/min; the carrier gas is nitrogen and the nitrogen gas flow is fixed at about 3.15 std litre/min; and the dopant gas flow, is varied among the following values: 0.00 std litre/min; 0.12 std litre/min; 0.25 std litre/min; 0.35 std litre/min; 0.50 std litre/min; and 0.65 std litre/min.

* * * * *